(12) United States Patent
Ahmadloo et al.

(10) Patent No.: US 11,349,203 B2
(45) Date of Patent: May 31, 2022

(54) AUTOMOTIVE RADAR SENSOR PACKAGING METHODS AND RELATED ASSEMBLIES

(71) Applicant: VEONEER US, INC., Southfield, MI (US)

(72) Inventors: Majid Ahmadloo, Lowell, MA (US); Robert J. Sletten, Bow, NH (US)

(73) Assignee: Veoneer US, Inc., Southfield, MI (US)

( * ) Notice: Subject to any disclaimer, the term of this patent is extended or adjusted under 35 U.S.C. 154(b) by 119 days.

(21) Appl. No.: 16/869,507

(22) Filed: May 7, 2020

(65) Prior Publication Data

US 2021/0351499 A1 Nov. 11, 2021

(51) Int. Cl.
| | | |
|---|---|---|
| *H01Q 1/32* | (2006.01) | |
| *H01L 23/66* | (2006.01) | |
| *H01L 23/552* | (2006.01) | |
| *H01L 25/18* | (2006.01) | |
| *H01L 23/367* | (2006.01) | |
| *G01S 7/02* | (2006.01) | |
| *H01Q 1/42* | (2006.01) | |
| *H01Q 13/10* | (2006.01) | |
| *G01S 13/931* | (2020.01) | |

(52) U.S. Cl.
CPC .......... *H01Q 1/3233* (2013.01); *G01S 7/023* (2013.01); *G01S 13/931* (2013.01); *H01L 23/3675* (2013.01); *H01L 23/552* (2013.01); *H01L 23/66* (2013.01); *H01L 25/18* (2013.01); *H01Q 1/427* (2013.01); *H01Q 13/10* (2013.01); *G01S 7/027* (2021.05); *H01L 2223/6677* (2013.01)

(58) Field of Classification Search
CPC ...... H01Q 1/3233; H01Q 1/427; H01Q 13/10; G01S 7/023; G01S 13/931; G01S 7/027
See application file for complete search history.

(56) References Cited

U.S. PATENT DOCUMENTS

| | | | |
|---|---|---|---|
| 10,147,854 B2 | 12/2018 | Shatalov et al. | |
| 2014/0240192 A1* | 8/2014 | Jeuland | H01Q 9/40 343/872 |
| 2018/0128901 A1* | 5/2018 | Pointer | H01Q 1/42 |
| 2018/0231657 A1* | 8/2018 | Woehlte | H01Q 1/3233 |
| 2018/0351243 A1* | 12/2018 | Lewis | B64C 1/36 |
| 2019/0081391 A1* | 3/2019 | Yasin | B60R 11/04 |

* cited by examiner

*Primary Examiner* — Marc Anthony Armand
(74) *Attorney, Agent, or Firm* — Matthew D. Thayne; Thayne and Davis LLC (57) ABSTRACT

RADAR or other sensor assemblies/modules, particularly those for vehicles, along with related manufacturing/assembly methods. In some embodiments, the assembly may comprise a housing and a printed circuit board. The printed circuit board may comprise a first side and a second side opposite the first side and may further comprise one or more integrated circuits positioned on the first side of the printed circuit board. One or more antennas may be operably coupled with the integrated circuit. A flexible radome, such as a thermoplastic wrapper, may enclose the assembly and may provide the means for binding the printed circuit board to the housing.

22 Claims, 8 Drawing Sheets

FIG. 7 a thermoplastic wrapper may comprise
a thermoplastic wrapper. In some such embodiments, the
thermoplastic wrapper may comprise a tube positioned over
the assembly and sealed at opposing ends thereof. The
thermoplastic wrapper may alternatively comprise opposing
thermoplastic sheets sealed about their respective perimeters
to enclose the assembly.

AUTOMOTIVE RADAR SENSOR PACKAGING METHODS AND RELATED ASSEMBLIES

SUMMARY

Disclosed herein are various embodiments of sensor assemblies, such as RADAR sensor assemblies for vehicles, along with related packaging methods.

Traditional sensor packaging techniques often require multiple, separate elements—such as the base housing unit, RF shield, and radome—to be attached together by coupling means such as fasteners, adhesives, potting, heat staking, and/or laser or ultrasonic welding. This often requires multiple considerations on the compatibility of different materials used in the process and thereby creates limitations in the selections of such materials and resultant cost increases. For example, potting often results in thermal incompatibility between the potting material and other components, such as the printed circuit board (PCB), and difficulties associated with dispensing and curing the material may make it less desirable from a manufacturing point of view.

The present inventors have determined that it would be desirable to provide apparatus, systems, and methods that overcome one or more of the foregoing limitations and/or other limitations of the prior art. In some embodiments, the inventive concepts disclosed herein may therefore provide packaging techniques and components for automotive sensors, such as RADAR sensors, preferably to integrate the components in a mechanically rigid form, protect them from environmental elements, and functionally serve as an antenna radome in a cost-effective manner.

In some embodiments disclosed herein, various electrical circuits/chips/microprocessors are preferably placed only on one side of the PCB and the RF signal will pass through the PCB to the other side, where antennae may be placed. This may maintain flatness, or at least substantial flatness, on this opposing side of the PCB as preferably no electrical and/or protruding components are positioned on the outer side of the PCB.

The PCB may then be coupled with a housing, which may comprise a metallic shield facing the component side, which may serve as a heat sink for one or more of the electrical components, such as the MMIC and/or DSP, and may also fully enclose the components in a metallic shield, which may be required in EMI suppressions and may support EMI requirements, which are typically rather difficult to meet due to the location of the MMIC chip on the antenna side of the board, which may inhibit EMI shielding.

In a more particular example of a vehicle sensor assembly, such as a RADAR sensor assembly, according to some embodiments, the assembly may comprise a housing and a printed circuit board coupled with the housing. The printed circuit board may comprise a first side and a second side opposite the first side. In preferred embodiments, the printed circuit board may be flat, or at least substantially flat, on at least one side. One or more integrated circuits, such as a MMIC, may be positioned on the first side of the printed circuit board. One or more antennae may be operably coupled with the integrated circuit(s). In some embodiments, the antennae may be positioned on the second side of the printed circuit board and/or may not protrude from the second side of the printed circuit board. For example, planar patch antennae may be provided on the second side. The assembly may further comprise a flexible radome enclosing the assembly.

In some embodiments, the flexible radome may comprise a thermoplastic wrapper. In some such embodiments, the thermoplastic wrapper may comprise a tube positioned over the assembly and sealed at opposing ends thereof. The thermoplastic wrapper may alternatively comprise opposing thermoplastic sheets sealed about their respective perimeters to enclose the assembly.

In some embodiments, the thermoplastic wrapper or other flexible radome may be configured to bind the printed circuit board to the housing. In some such embodiments, the thermoplastic wrapper or other flexible radome may be configured to bind the printed circuit board to the housing without using any mechanical fasteners. In some such embodiments, the thermoplastic wrapper or other flexible radome may be configured to bind the printed circuit board to the housing without using any mechanical fasteners or without any other coupling means, such as welding or adhesives (adhesives may be used to close the wrapper/radome, however, in some such embodiments).

Some embodiments may further comprise a metallic shield coupled with the housing, the metallic shield being configured to provide electromagnetic interference shielding to the integrated circuit. In some such embodiments, the metallic shield may comprise an integral part of the housing. For example, the metallic shield may comprise one or more walls and/or fences that may be part of a stamped or cast metallic housing.

Some embodiments may further comprise a microprocessor positioned on the first side of the printed circuit board.

In some embodiments, one or more of the electrical components, such as the integrated circuit, may be thermally coupled to the housing. Some embodiments may therefore comprise a thermal coupling element, such as a thermal pad or the like, positioned within the metallic shield and coupled with the integrated circuit.

In some embodiments, each of the one or more antennas may be positioned at the second side of the printed circuit board. Such antennae may comprise, for example, planar patch antennae or, alternatively, slot antennae.

In some embodiments, the printed circuit board may lack any projecting electrical components on the second side.

In another specific example of a vehicle sensor assembly, such as a vehicle RADAR sensor assembly, according to other embodiments, the assembly may comprise a housing defining a plurality of waveguides. In some embodiments, each waveguide of the plurality of waveguides may be defined by a waveguide groove. A printed circuit board comprising a first side and a second side opposite the first side may be coupled to the housing. An integrated circuit may be coupled to the printed circuit board on the first side of the printed circuit board. An antenna structure may be operably coupled with plurality of waveguides. In some embodiments, the antenna structure may comprise an array of one or more slots extending along an axis of each waveguide groove of the plurality of waveguides, with each of the one or more slots being configured to deliver and/or receive electromagnetic radiation from at least one of the plurality of waveguides therethrough. A flexible radome may enclose the housing and the printed circuit board.

In some embodiments, the flexible radome may comprise a thermoplastic wrapper. Such wrapper may, in some such embodiments, be configured to rigidly affix the printed circuit board to the housing without use of any mechanical fasteners and/or other means for coupling.

In some embodiments, the housing may further comprise a hub. The hub may comprise one or more thermal coupling pads configured to contact the integrated circuit.

The housing may further comprise a domed structure or other projecting member. In some such embodiments, the thermal coupling pad may be positioned on the domed structure or other projecting member.

Some embodiments may further comprise a metallic shield coupled with the housing. The metallic shield may be configured to provide electromagnetic interference shielding to the integrated circuit In an example of a method for assembling a vehicle sensor assembly according to some implementations, the method may comprise forming a metallic shield on a housing. This may be done, for example, by forming a fence structure from a cast and/or metallic housing. A printed circuit board may be coupled to the housing, the printed circuit board having a first side and a second side opposite the first side. The printed circuit board may be coupled to the housing such that the first side faces the housing. The printed circuit board may comprise an integrated circuit positioned on the first side of the printed circuit board. The printed circuit board may be coupled to the housing such that the integrated circuit is positioned within the metallic shield to provide electromagnetic interference shielding to the integrated circuit. A thermoplastic wrapper or other flexible radome may be used to rigidly affix the printed circuit board to the housing and/or seal the assembly from the environment.

In some implementations, the step of forming the metallic shield may comprise forming a metallic fence about a thermal coupling pad. In some implementations, the step of coupling the printed circuit board to the housing may comprise contacting the integrated circuit with the thermal coupling pad to provide a heat sink to the integrated circuit.

In some implementations, a projecting member may be positioned within the metallic fence to facilitate contact between the integrated circuit and the thermal coupling pad by, for example, extending the thermal coupling pad away from a lower surface of the housing.

In some implementations, the step of sealing a thermoplastic wrapper about the housing and the printed circuit board may comprise inserting the housing and printed circuit board into a thermoplastic tube and heat sealing opposing edges of the thermoplastic tube to seal the assembly therein. In some implementations, the tube may be vacuum sealed.

In some implementations, the printed circuit board may comprise one or more antennas, each of which may be positioned along the second side of the printed circuit board.

The features, structures, steps, or characteristics disclosed herein in connection with one embodiment may be combined in any suitable manner in one or more alternative embodiments.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

A detailed description of apparatus, systems, and methods consistent with various embodiments of the present disclosure is provided below. While several embodiments are described, it should be understood that the disclosure is not limited to any of the specific embodiments disclosed, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure may be best understood by reference to the drawings, wherein like parts may be designated by like numerals. It will be readily understood that the components of the disclosed embodiments, as generally described and illustrated in the figures herein, could be arranged and designed in a wide variety of different configurations. Thus, the following detailed description of the embodiments of the apparatus and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified. Additional details regarding certain preferred embodiments and implementations will now be described in greater detail with reference to the accompanying drawings.

Figure 1A:
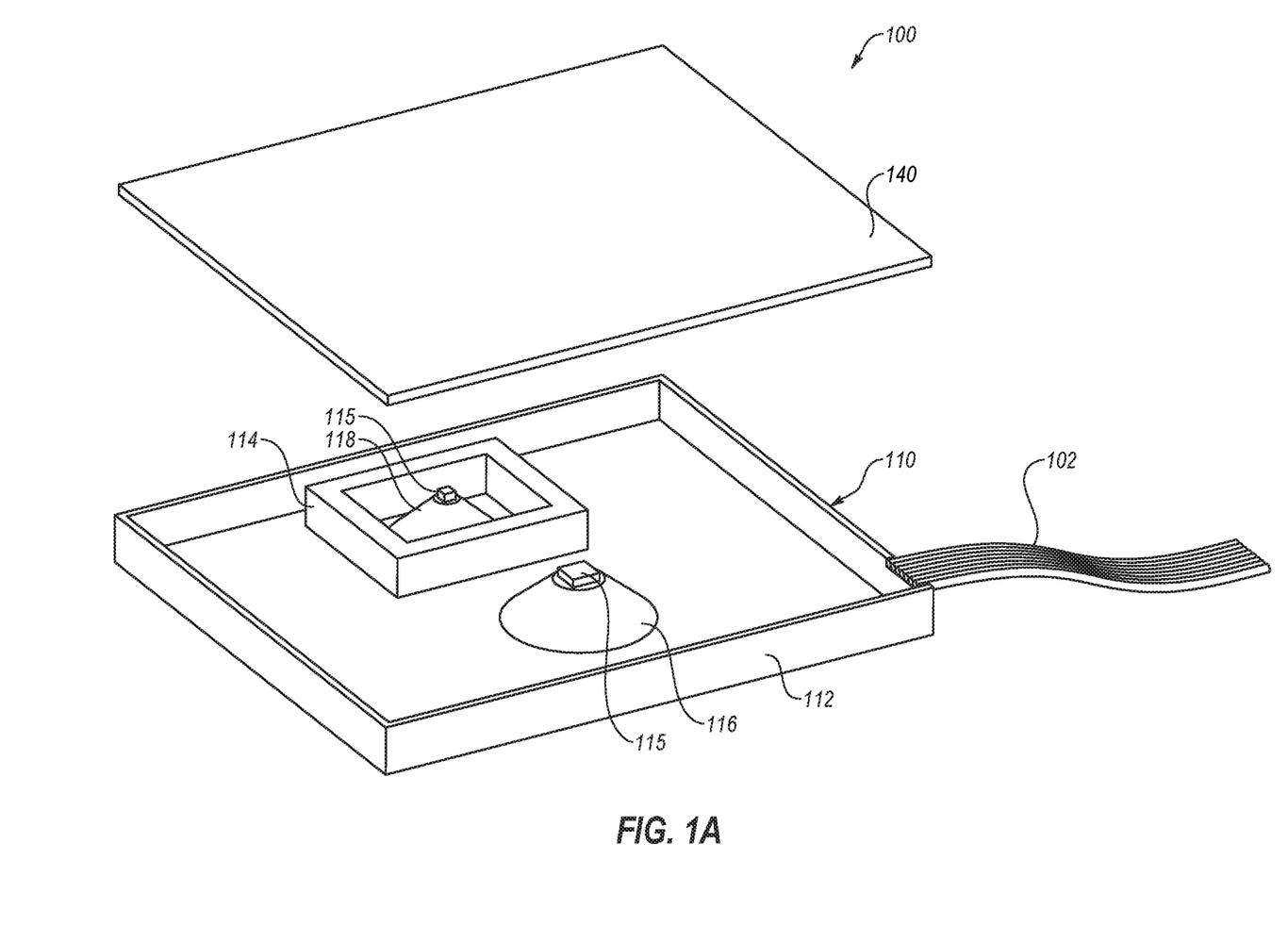
FIG. 1A is an upper, exploded perspective view of a RADAR or other remote sensor assembly for a vehicle according to some embodiments.
Figure 1B:
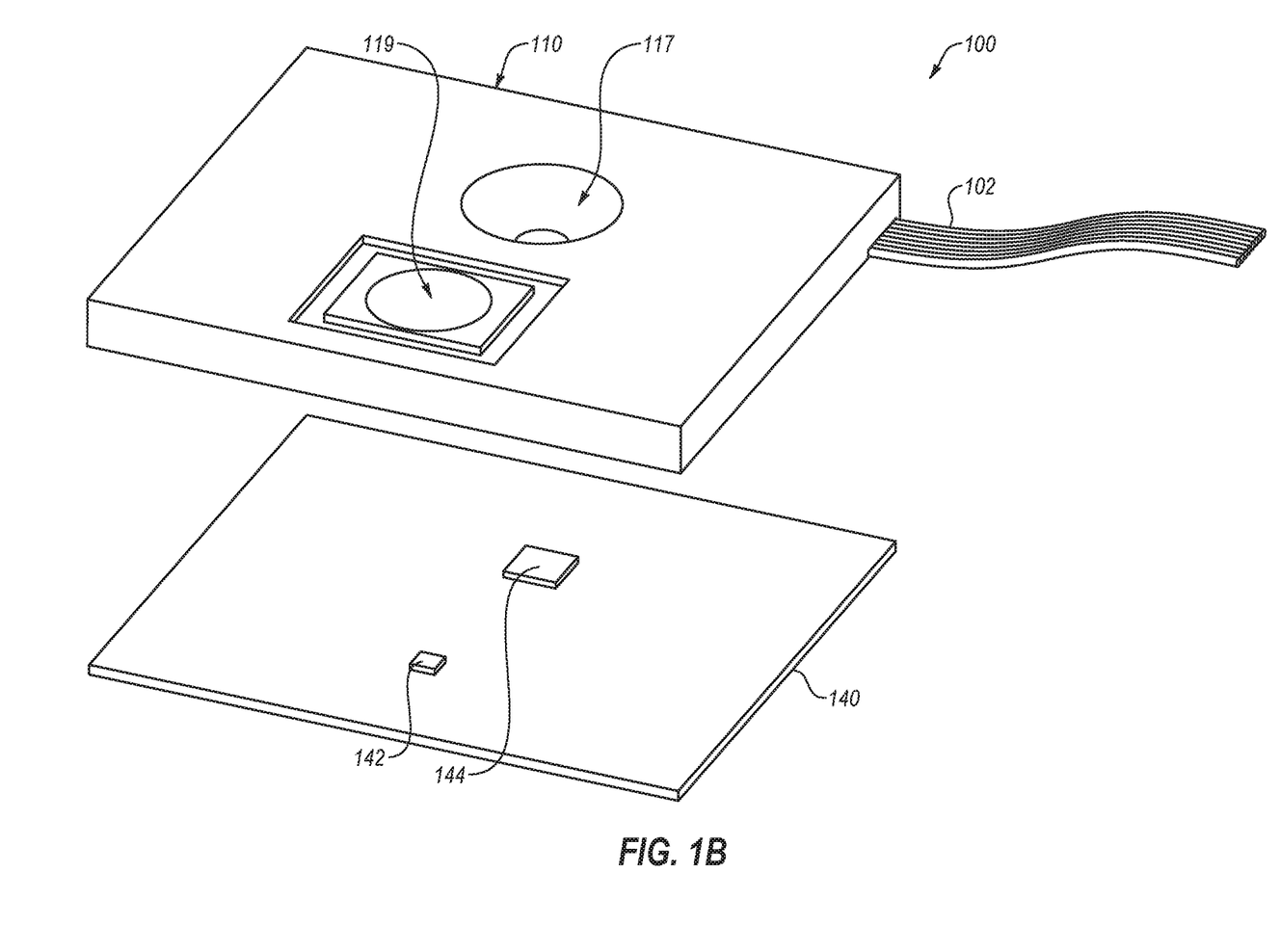
FIG. 1B is a lower, exploded perspective view of the remote sensor assembly of FIG. 1A.

FIGS. 1A and 1B depict an example of a RADAR sensor assembly/module 100 according to some embodiments. Assembly 100 comprises a housing 110, which may, in some preferred embodiments, comprise a cast metallic housing. A wall 112 is formed about the perimeter of housing 110, which may provide EMI shielding, and one or more wires, such as a ribbon wire/cable 102 or the like, may be used to provide electrical communication to and from the electrical components of assembly 100.

Housing 110 may further comprise one or more mounds or other projecting members. For example, in the depicted embodiment, a first projecting member 116 and a second projecting member 118 are provided. These projecting members may be the same or a similar height to the height of the surrounding walls 112 of the assembly. In this manner, one or more electrical components of the assembly 100 may contact housing 110 to act as a heat sink for these components. Thus, in preferred embodiments, thermal coupling elements may be positioned at the peak of the various projecting members. In the depicted embodiment, a thermal coupling pad 115 is therefore shown positioned on top of both projecting members 116/118. As those of ordinary skill in the art will appreciate, thermal coupling pads 115 may, in some embodiments, comprise a gel, foam, or other suitable material configured to facilitate thermal conductivity between the housing 110 and an adjacent electrical component of assembly 100.

One or more of the projecting members and/or thermal coupling elements may further comprise electrical shielding means. For example, as shown in FIG. 1A, a fence 114 is provided about projecting member 118, which may provide for EM shielding. This metallic shield/wall/fence 114 may also provide structural support to the assembly and, more particularly, to the adjacent printed circuit board 140 of the assembly, as discussed in greater detail below. The shielding may allow for meeting strict EMI requirements, which are often rather difficult to meet for similar assemblies due to the typical location of a MMIC chip on the antenna side of the board, which prevents the chip from being fully shielded by a metallic enclosure. Thus, as discussed in greater detail below, by providing a board with electrical components positioned towards the shielding elements and only antennae on the opposite side (no projecting electrical components), the housing may act as a heat sink and provide desired metallic EMI shielding.

A printed circuit board (PCB) 140 or other suitable electrical board or other component may be coupled with the housing 110. As described in greater detail below, in some preferred embodiments, the PCB 140 may be flat, or at least substantially flat, on one side. Thus, for example, in some embodiments, protruding electrical components may be entirely absent from one side of the PCB 140 or other "lid" for assembly 100.

On the opposite side, one or more electrical circuits or other electrical components may be positioned on PCB 140. Thus, as shown in FIG. 1B, a first electrical circuit component 142, such as a monolithic microwave integrated circuit (MMIC) may be positioned on one portion of PCB 140 and a second electrical circuit component 144, such as a digital signal processor (DSP) 144, may be positioned on another portion of PCB 140.

MMIC 142 is positioned on PCB 140 so as to provide for physical contact with thermal pad 115 positioned on protruding member 118 within fence 114 once PCB 140 has been physically coupled with housing 110. Similarly, DSP 144 is positioned on PCB 140 so as to provide for physical contact with the thermal pad 115 positioned on protruding member 116.

As also shown in FIG. 1B, the opposite side of housing 110 may, in some embodiments, comprise various depressions or other imprints that may result from stamping of the protruding members 116/118 and/or fences/walls 114 present on the other side. Of course, other embodiments are contemplated in which these impressions need not be present and/or the protruding members and/or fences need not be present. For example, in some embodiments, protruding members or other elements configured to facilitate contact with various electrical elements to provide a thermal heat sink may be coupled with or formed on one side of housing 110 without forming any impressions on the opposite side.

Figure 2:
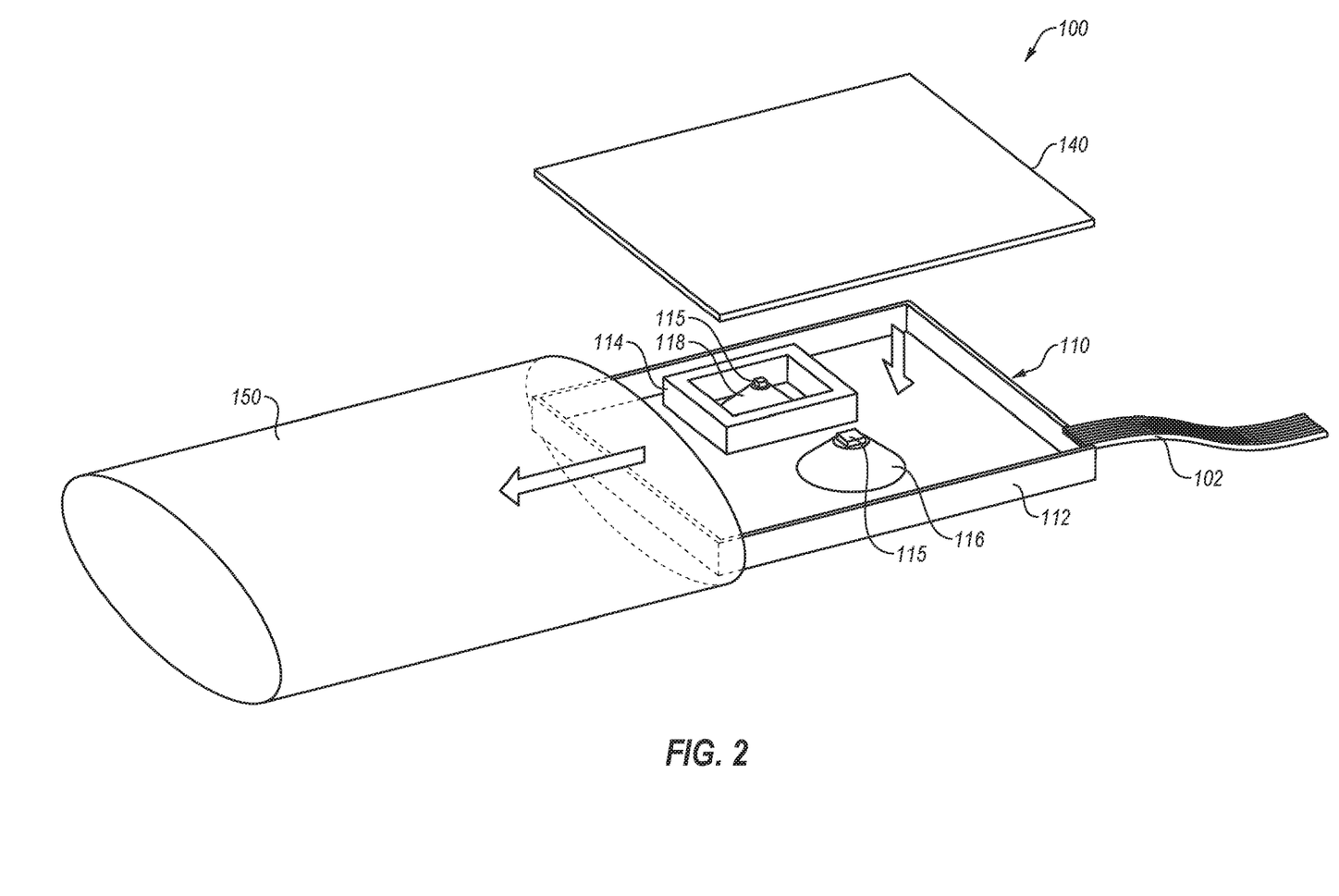
FIG. 2 depicts the assembly of FIGS. 1A and 1B being inserted into a flexible wrapper configured to bind the separate elements of the assembly together and seal them within the wrapper.

FIG. 2 depicts assembly 100 during a manufacturing step in which PCB 140 is coupled with housing 110. In preferred embodiments and implementations of related inventive methods, this coupling step may be done without use of any screws, bolts, heat staking, or other fasteners. Instead, a flexible radome 150 may be used. In the depicted embodiment, flexible radome 150 comprises a thermoplastic wrapper 150 that may have at least one open end to allow the other components of the assembly to be inserted. In the depicted embodiment, both opposing ends of wrapper 150 are open initially such that the assembly may be inserted through either end and then ultimately sealed at both ends. Of course, in other embodiments, an opening may only be formed at one end, which may allow for, in preferred embodiments and implementations, subsequent sealing of just a single opening.

In preferred embodiments and implementations, wrapper 150 is configured to fixedly and/or tightly hold PCB 140 onto housing 110 again, preferably without the use of any other fasteners or mechanical fastening elements/techniques. In some embodiments, assembly 100 may be manufactured also without the use of any other coupling means, such as adhesives, potting, or welding. Again, a firm, rigid, coupling may be provided by wrapper 150 alone in preferred embodiments.

In addition, wrapper 150 is preferably packaged around assembly 100 so as to provide a hermetic and/or liquid-tight seal around the assembly 100, which may provide protection in cases in which assembly 100 is used as a vehicle sensor module. Thus, wrapper 150 in preferred embodiments may serve as a binding means to hold housing 110 and PCB 140 together in proper position, while also functionally operating as a radome and preferably hermetically sealing the assembly 100. Wrapper 150 may comprise, for example, a polyolefin material or another suitable, preferably flexible thermoplastic material.

Figure 3:
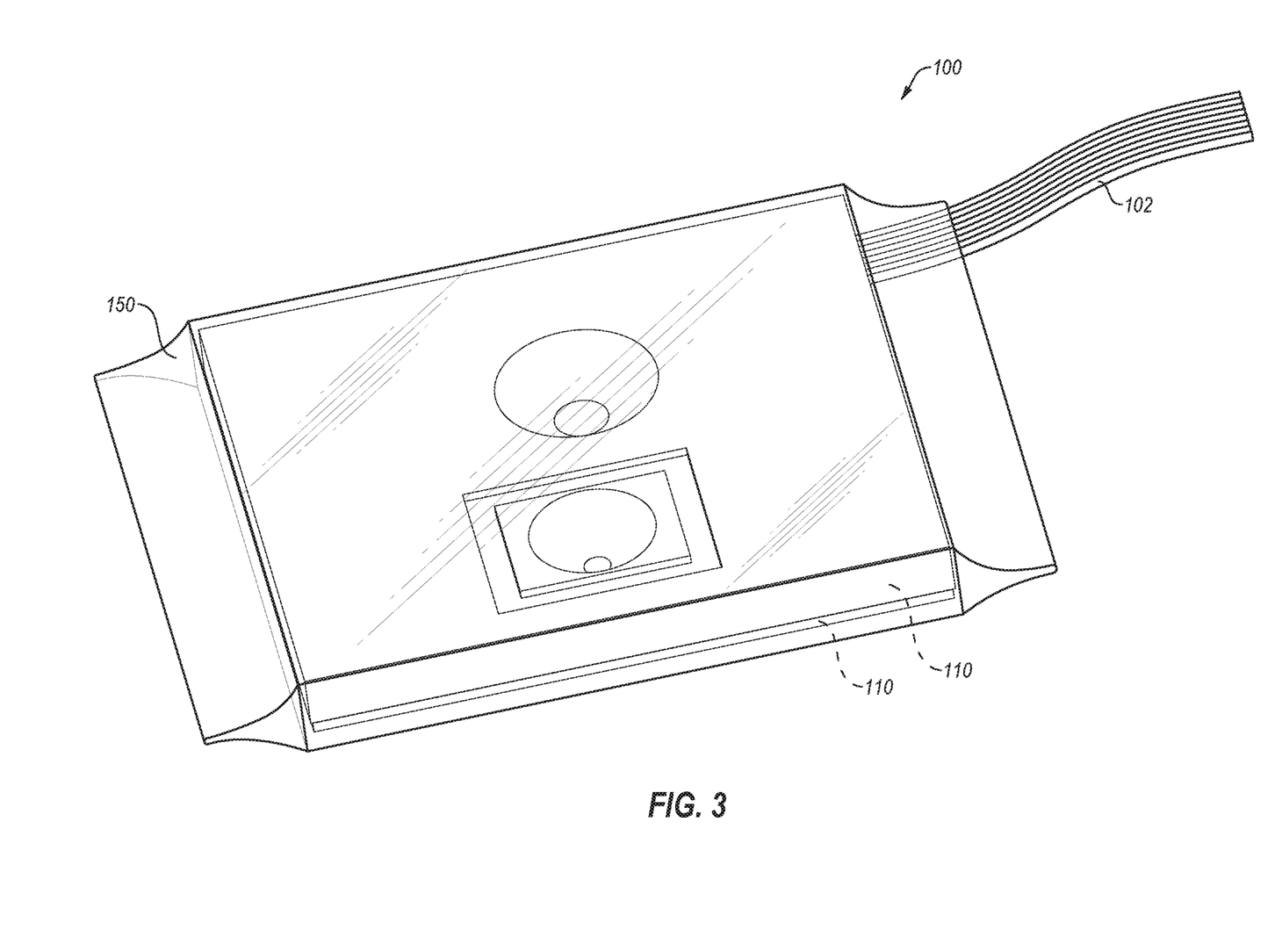
FIG. 3 is a perspective view of the assembly following sealing of the wrapper about the internal components of the assembly.

Thus, as shown in FIG. 3, once both ends have been sealed, a sensor module is provided that may provide heat sinking, thermal shielding, and radome functionality in a unique manner not previously accomplished. The sealing of wrapper 150 may be accomplished, for example, by use of heat shrinking, adhesive layers, and/or vacuum sealing techniques available to those of ordinary skill in the art.

Figure 4:
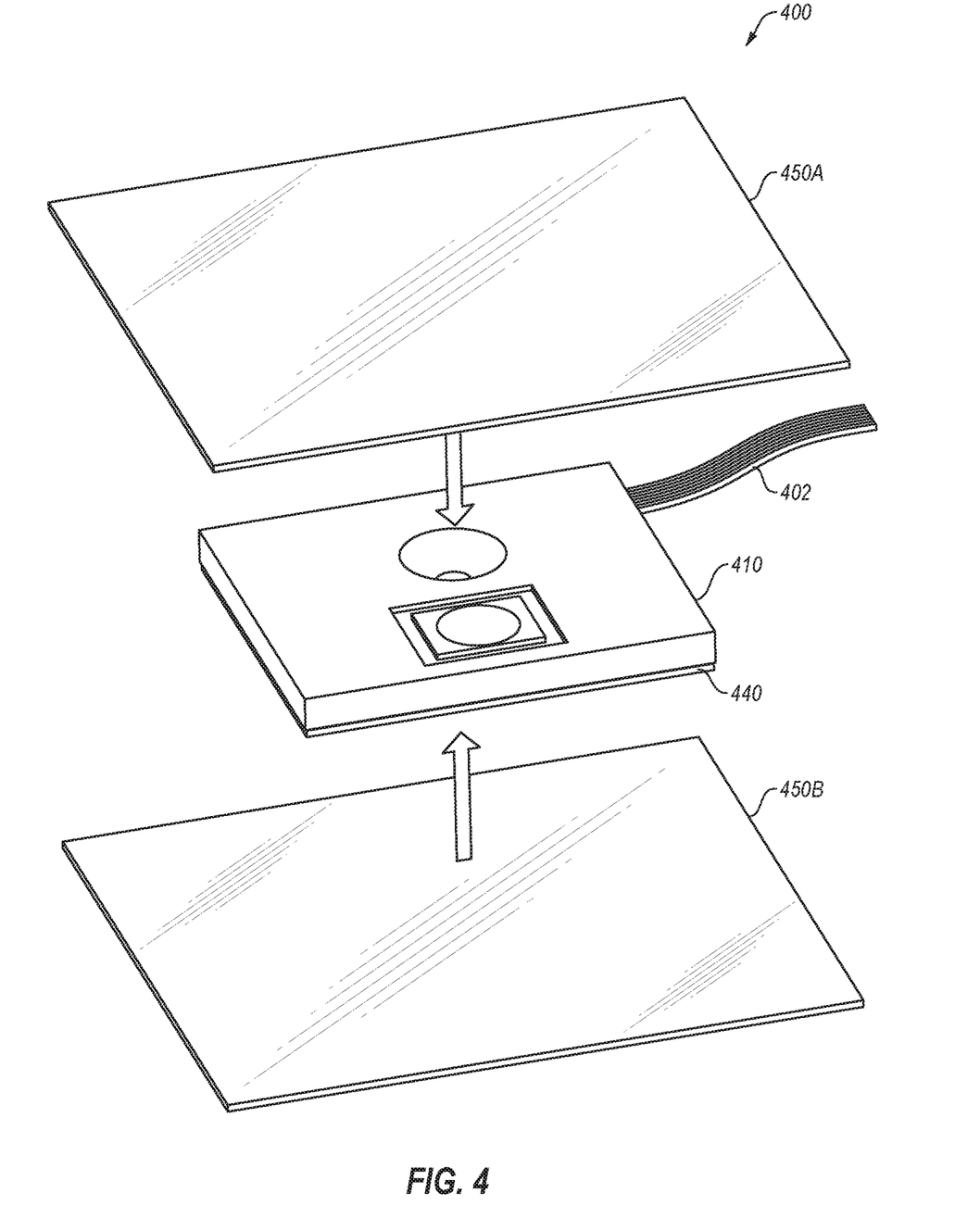
FIG. 4 is an exploded, perspective view of a vehicle sensor assembly according to other embodiments.
Figure 5:
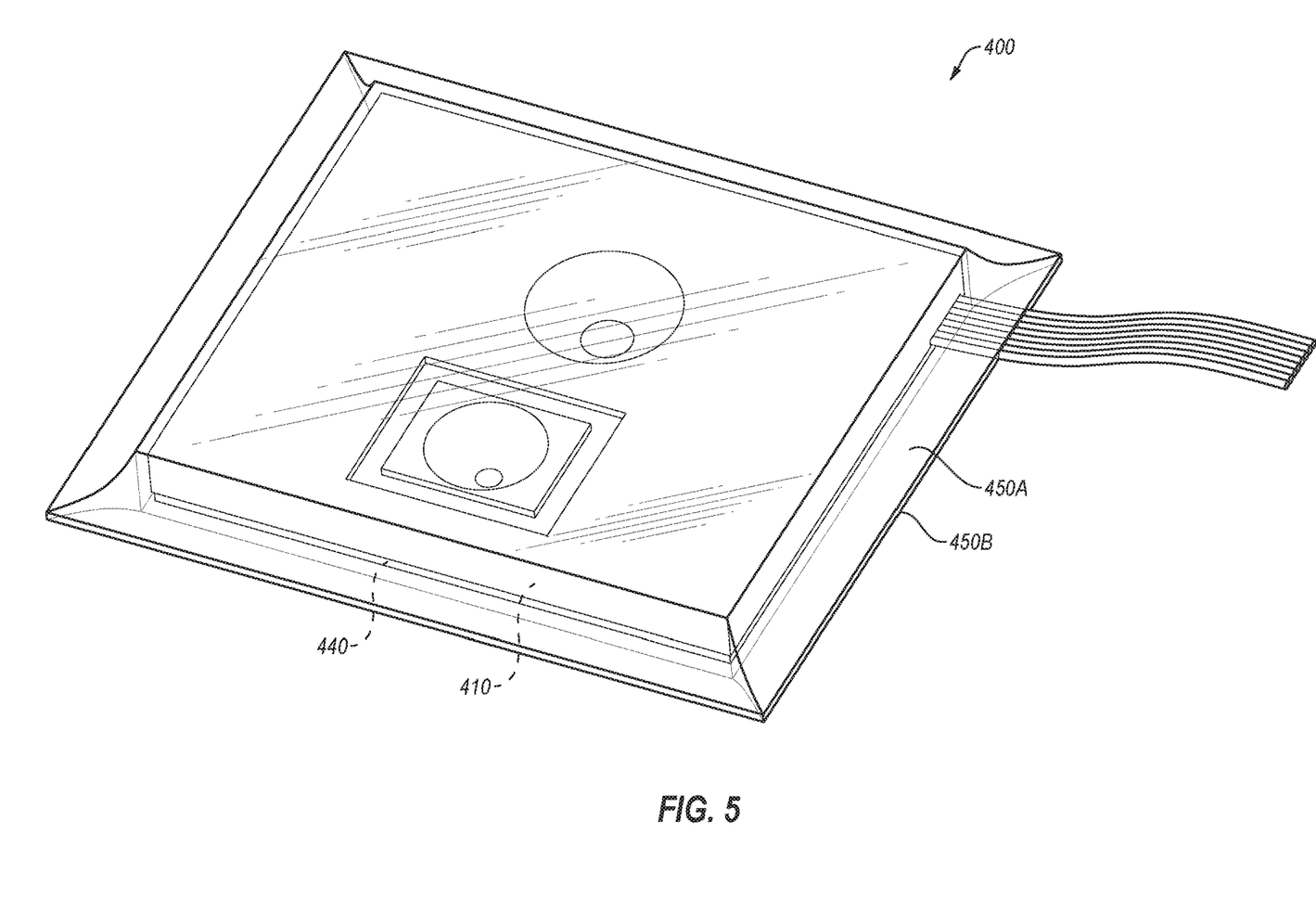
FIG. 5 is a perspective view of the vehicle sensor assembly of FIG. 4 following sealing of opposing flexible sheets together about their perimeters to form a flexible radome and/or packaging wrapper.

FIGS. 4 and 5 illustrate another example of a RADAR or other vehicle sensor assembly 400 according to other embodiments. As shown in FIG. 4, assembly 400 may again comprise a housing 410 and a PCB 440. Various cables or wires 402 may extend from housing 410 to provide for desired electrical connections. However, rather than providing a sleeve-like wrapper, such as wrapper 150, assembly 400 comprises a flexible radome/wrapper defined by two opposing sheets, namely sheet 450A and sheet 450B, together which may couple PCB 440 to housing 410 and/or provide a seal to functionally serve as a radome to assembly 400, as shown in FIG. 5. FIG. 5 depicts the opposing sheets 450A/450B sealed to one another about their respective perimeters, which may be accomplished using, for example, any of the techniques described above or elsewhere herein.

Although not shown in FIGS. 4 and 5, it should be understood that assembly 400 may otherwise be similar to assembly 100. Thus, PCB 440 may comprise one or more circuits or other electrical elements, preferably only on one side of PCB 440 such that the opposite side is free, or at least substantially free, from any such protruding electrical components. In some such embodiments, this opposite side of PCB 440 may be flat and may serve as the antenna/planar side of the assembly 400. The component side of PCB 440 may, again, be configured to provide for thermal contact between one or more such components and at least a portion of the housing 410 to serve as a heat sink. Also, the housing 410 preferably serves as an EMI shield to one or more of these components, as also previously discussed.

Figure 6:
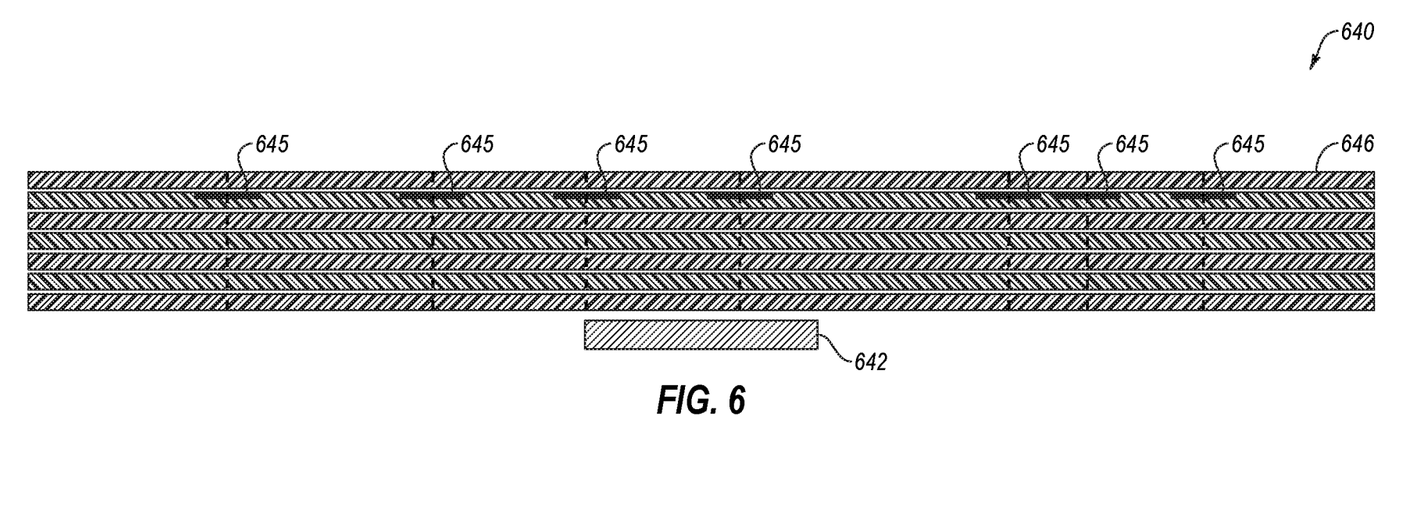
FIG. 6 is a cross-sectional view of a printed circuit board for use in connection with one or more of the vehicle sensor assemblies disclosed herein.

FIG. 6 is a cross-sectional view of a PCB 640 suitable for use in connection with any of the embodiments discussed herein. As shown in this figure, PCB 640 comprises an electrical component 642 only on one side of the board. The other side of the board is free from protruding electrical components, as previously mentioned. Component 642 may comprise, for example, a MMIC, DSP, or any other circuit/chip as desired.

A series of flat antennae 645, such as planar patch antennae 645, may be formed on the flat/component-free side of PCB 640, each of which may be communicatively coupled with element 642 and/or various other chips/circuits on the opposite side, in some cases by way of transmission vias extending through PCB 640. In some embodiments, a laminate layer 646 may be formed on top of antennae 645, which may provide additional protection.

Figure 7:
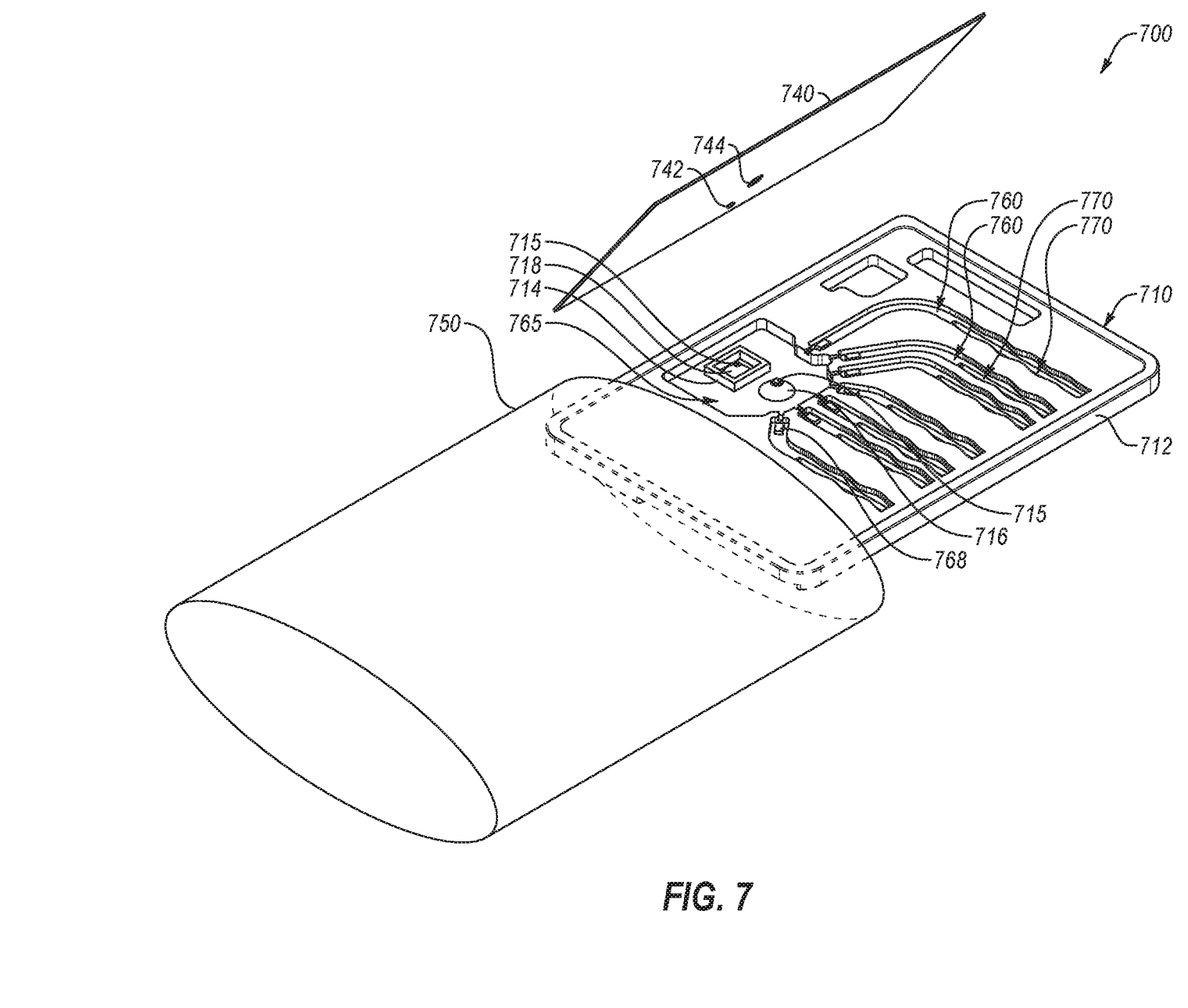
FIG. 7 is an exploded, perspective view of a vehicle sensor assembly according to still other embodiments.

FIG. 7 depicts yet another example of a sensor assembly 700, which may be particularly suitable for use as a RADAR sensor module for a vehicle. Assembly 700 again comprises a housing 710 defining a peripheral wall 712, which, again, may comprise a cast metallic housing in some embodiments. As with the other embodiments, a PCB 740 comprising various electrical components, such as a MMIC 742 and DSP 744, is positioned on one side of PCB 740 (the side facing towards housing 710).

These electrical components are configured to make contact with one or more thermal pads 715 or the like, each of which may be positioned on a protruding member, such as protruding members 716 and 718, to ensure that proper contact is made to serve as a heat sink for electrical components 742/744. As discussed in connection with previous embodiments, an EMI shield 714 may also be provided for one or more of the electrical components 742/744, which may take the form of a metallic/conductive fence 714 extending about a perimeter of MMIC 742 (once PCB 740 has been firmly bound to housing 710).

It should be understood that a variety of alternative embodiments are contemplated, however. For example, a fence or other EMI shield may be formed directly on the PCB instead of on the housing if desired. In addition, such shields/fences may be formed about other electrical components of the PCB/board if desired.

In the depicted embodiment, the aforementioned protruding members 716/718, thermal pads 715, and EMI shield 714, are positioned in a central hub region 765 of the assembly 700, which region has a plurality of waveguides extending therefrom. More particularly, a series of waveguide grooves 760 are formed, each of which comprises an elongated slot 770 formed therein.

In some embodiments, at least a portion of one or more (in some cases, each), of the waveguide grooves 760 may oscillate back and forth, as shown in FIG. 7. Slots 770 may extend along the oscillating portion of each waveguide groove 760. In the depicted embodiment, each slot 770 is centered within its respective groove. It should be understood that, in alternative embodiments, other types of waveguides may be used, such as, for example, forming a plurality of posts in opposing rows to define waveguide grooves therebetween. In addition, the waveguide grooves need not oscillate in other contemplated embodiments. Each of the various slots 770 may be configured to deliver electromagnetic radiation from its corresponding waveguide groove 760 therethrough and/or receive electromagnetic radiation and deliver such radiation into its corresponding waveguide groove 760.

It should be understood that hub region 765 would typically include various electrical components, such as electromagnetic generation chips or other elements, that are not shown in FIG. 7 to avoid obscuring the disclosure. A suitable electromagnetic feed or transition structure 768 to facilitate transitioning electromagnetic waves/signals to waveguide grooves 760 is also shown positioned at a terminal end of each of the waveguide grooves 760.

Assembly 700 may otherwise be similar to those previously described. Thus, for example, a flexible radome, which may comprise a flexible wrapper 750, may be used to provide several functions. As previously mentioned, wrapper 750 may serve as a radome to seal the assembly, preferably hermetically, to protect the assembly from the elements when mounted to a vehicle. Wrapper 750 may also be used, preferably in lieu of any additional fasteners and in some embodiments without any other means for fastening whatsoever (welding, for example), to apply the needed forces to keep PCB 740 tightly bound to housing 710 and ensure contact between the various electrical components 742/744 and a portion of housing 710 and/or thermal pads 715 or other similar features to provide a suitable heat sink for the assembly. Again, this may be done using opposing thermoplastic sheets, closed tubes, vacuum sealing, heat sealing, and/or the like to ensure a proper seal and preferably provide benefits akin to a more traditional radome for a RADAR assembly.

The foregoing specification has been described with reference to various embodiments and implementations. However, one of ordinary skill in the art will appreciate that various modifications and changes can be made without departing from the scope of the present disclosure. For example, various operational steps, as well as components for carrying out operational steps, may be implemented in various ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

Those having skill in the art will appreciate that many changes may be made to the details of the above-described embodiments without departing from the underlying principles of the invention. The scope of the present inventions should, therefore, be determined only by the following claims.

The invention claimed is:

1. A vehicle sensor assembly, comprising:
   a housing;
   a printed circuit board coupled to the housing, the printed circuit board comprising a first side and a second side opposite the first side;
   an integrated circuit positioned on the first side of the printed circuit board;
   one or more antennas operably coupled with the integrated circuit; and
   a flexible radome fully enclosing the assembly about an entire perimeter of the assembly.

2. The vehicle sensor assembly of claim 1, wherein the flexible radome comprises a thermoplastic wrapper, and wherein the thermoplastic wrapper is configured to bind the printed circuit board to the housing.

3. The vehicle sensor assembly of claim 2, wherein the thermoplastic wrapper comprises a tube positioned over the assembly and sealed at opposing ends thereof.

4. The vehicle sensor assembly of claim 2, wherein the thermoplastic wrapper comprises opposing thermoplastic sheets sealed about their respective perimeters to enclose the assembly.

5. The vehicle sensor assembly of claim 1, further comprising a metallic shield coupled with the housing, the metallic shield being configured to provide electromagnetic interference shielding to the integrated circuit, wherein the metallic shield comprises an integral part of the housing.

6. The vehicle sensor assembly of claim 1, further comprising a microprocessor positioned on the first side of the printed circuit board.

7. The vehicle sensor assembly of claim 1, wherein the vehicle sensor assembly comprises a RADAR sensor assembly.

8. The vehicle sensor assembly of claim 1, wherein the integrated circuit is thermally coupled to the housing.

9. The vehicle sensor assembly of claim 8, further comprising a thermal coupling element positioned within the metallic shield and coupled with the integrated circuit.

10. The vehicle sensor assembly of claim 1, wherein each of the one or more antennas is positioned at the second side of the printed circuit board.

11. The vehicle sensor assembly of claim 1, wherein each of the one or more antennas comprises slot antennas.

12. The vehicle sensor assembly of claim 1, wherein the printed circuit board lacks any projecting electrical components on the second side.

13. A vehicle sensor assembly, comprising:
a housing defining a plurality of waveguides, wherein each waveguide of the plurality of waveguides is defined by a waveguide groove;
a printed circuit board coupled with the housing to define an enclosure between the housing and the printed circuit board, the printed circuit board comprising a first side and a second side opposite the first side;
an integrated circuit positioned on the first side of the printed circuit board;
an antenna structure operably coupled with plurality of waveguides, wherein the antenna structure comprises an array of one or more slots extending along an axis of each waveguide groove of the plurality of waveguides, and wherein each of the one or more slots is configured to deliver electromagnetic radiation from at least one of the plurality of waveguides therethrough; and
a flexible radome fully enclosing the enclosure defined by the housing and the printed circuit board.

14. The vehicle sensor assembly of claim 13, wherein the flexible radome comprises a thermoplastic wrapper.

15. The vehicle sensor assembly of claim 13, wherein the housing further comprises a hub, and wherein the hub comprises a thermal coupling pad configured to contact the integrated circuit.

16. The vehicle sensor assembly of claim 15, wherein the housing comprises a domed structure, wherein the thermal coupling pad is positioned on the domed structure.

17. The vehicle sensor assembly of claim 13, further comprising a metallic shield coupled with the housing, the metallic shield being configured to provide electromagnetic interference shielding to the integrated circuit.

18. A method for assembling a vehicle sensor assembly, the method comprising the steps of:
forming a metallic shield on a housing;
coupling a printed circuit board to the housing, the printed circuit board having a first side and a second side opposite the first side, wherein the printed circuit board is coupled to the housing such that the first side faces the housing, wherein the printed circuit board comprises an integrated circuit positioned on the first side of the printed circuit board, and wherein the printed circuit board is coupled to the housing such that the integrated circuit is positioned within the metallic shield to provide electromagnetic interference shielding to the integrated circuit; and
sealing a flexible thermoplastic wrapper about an entire perimeter of the thermoplastic wrapper to fully enclose the housing and the printed circuit board.

19. The method of claim 18, wherein the step of forming the metallic shield comprises forming a metallic fence about a thermal coupling pad, and wherein the step of coupling the printed circuit board to the housing comprises contacting the integrated circuit with the thermal coupling pad.

20. The method of claim 19, wherein the housing further comprises a projecting member positioned within the metallic fence to facilitate contact between the integrated circuit and the thermal coupling pad.

21. The method of claim 18, wherein the step of sealing a flexible thermoplastic wrapper about the housing and the printed circuit board comprises:
inserting the housing coupled with the printed circuit board into a thermoplastic tube; and
heat sealing opposing edges of the thermoplastic tube.

22. The method of claim 18, wherein the printed circuit board comprises one or more antennas, and wherein each of the one or more antennas is positioned along the second side of the printed circuit board.

* * * * *